(12) United States Patent
Moessinger et al.

(10) Patent No.: US 7,434,118 B2
(45) Date of Patent: Oct. 7, 2008

(54) PARAMETERIZED SIGNAL CONDITIONING

(75) Inventors: Marc Moessinger, Sindelfingen (DE);
Dieter Ohnesorge, Simmozheim (DE);
Christoph Zender, Rottenburg (DE);
Bernd Laquai, Stuttgart (DE); Markus Rottacker, Stuttgart (DE); Jochen Rivoir, Magstadt (DE); Alfred Rosenkraenzer, Herrenberg (DE);
Klaus-Peter Behrens, Gaertingen (DE);
Christian Sebeke, Ehningen (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 294 days.

(21) Appl. No.: 10/816,646

(22) Filed: Apr. 2, 2004

(65) Prior Publication Data
US 2004/0255213 A1    Dec. 16, 2004

(30) Foreign Application Priority Data
Apr. 4, 2003    (EP) .................................. 03100902
Sep. 16, 2003    (EP) .................................. 03103406

(51) Int. Cl.
*G01R 31/28* (2006.01)
(52) U.S. Cl. ........................ 714/715; 710/316
(58) Field of Classification Search ............. 714/729, 714/715–719, 724; 716/6; 710/316
See application file for complete search history.

(56) References Cited

U.S. PATENT DOCUMENTS

| 4,660,170 | A | * | 4/1987 | Hui et al. .................... 710/316 |
| 5,606,567 | A |   | 2/1997 | Agrawal et al. ............. 371/22.4 |
| 5,781,559 | A | * | 7/1998 | Muris et al. .................. 714/726 |
| 5,886,901 | A | * | 3/1999 | Magoshi ......................... 716/6 |
| 6,239,611 | B1 |  | 5/2001 | Matera ........................ 326/16 |
| 6,333,625 | B1 | * | 12/2001 | Linder .......................... 324/66 |
| 6,634,811 | B1 |  | 10/2003 | Gertel et al. ................ 398/159 |
| 2003/0048209 | A1 |  | 3/2003 | Buchanan et al. ........... 341/100 |
| 2003/0145268 | A1 | * | 7/2003 | Wang ........................ 714/738 |
| 2003/0154434 | A1 | * | 8/2003 | Hou ............................ 714/734 |

FOREIGN PATENT DOCUMENTS

| EP | WO 02/054240 | 7/2002 |
| JP | 05-158572 | 6/1993 |
| JP | 2000-163994 | 6/2000 |

OTHER PUBLICATIONS

Patent Abstracts of Japan, Publication No. 2000341135.
Patent Abstracts of Japan, Publication No. 2001292178.
European Office Action dated Aug. 14, 2007.

* cited by examiner

*Primary Examiner*—Cynthia Britt
(74) *Attorney, Agent, or Firm*—Perman & Green, LLP

(57) ABSTRACT

A coupling unit is adapted to be coupled between a first and a second unit to be tested. Said coupling unit comprises a first signal path that is adapted to provide a signal connection between at least one terminal of the first unit to be tested and at least one terminal of the second unit to be tested. The first signal path comprises a signal conditioning facility adapted for receiving a first signal from the first unit to be tested, for conditioning said first signal in accordance with predefined parameters, and for providing the conditioned first signal to the second unit to be tested.

25 Claims, 6 Drawing Sheets

PARAMETERIZED SIGNAL CONDITIONING

BACKGROUND OF THE INVENTION

For testing the functionality of a device under test (DUT), an automated test equipment (ATE) can be used. Said ATE might comprise a multitude of channels, with said channels being adapted for providing stimulus signals to and receiving response signals from the DUT.

Loop-back testing has been applied in various fields, in particular for testing electronic devices. In loop-back testing, an output of a device to be tested is coupled to an input of said device, thus allowing testing performance of one or both the output and the input when applying adequate test signals. Instead of testing only one device, multiple devices interconnected with each other can be tested accordingly.

SUMMARY OF THE INVENTION

It is an object of the invention to provide an improved testing. The object is solved by the independent claims. Preferred embodiments are shown by the dependent claims.

A coupling unit according to an embodiment of the present invention is adapted to be coupled between a first and a second unit to be tested. The coupling unit comprises a first signal path that is adapted to provide a signal connection between at least one terminal of the first unit to be tested and at least one terminal of the second unit to be tested. The first signal path comprises a signal conditioning facility adapted for receiving a first signal from the first unit to be tested, for conditioning said first signal in accordance with predefined parameters, and for providing the conditioned first signal to the second unit to be tested.

The first signal received from the first unit to be tested can be modified in various different ways by said signal conditioning facility before it is provided to the second unit to be tested. By means of a set of parameters, the user may define how the first signal shall be modified.

Instead of the simple wire loop of prior art solutions, a coupling unit comprising a signal conditioning facility is used. Thus, a parameterized loop-back can be accomplished. The coupling unit allows to provide conditioned first signals with a variety of different properties to the second unit to be tested. For example, the coupling unit according to an embodiment of the present invention allows to intentionally degrade the signal received from the first unit's drive path before the modified signal is provided to the second unit's receive path. Thus, properties of the second unit's receive path, such as e.g. timing margins and/or level margins of the second unit's receive path, might e.g. be tested. For example, by imposing a certain amount of jitter upon the data signal, it is possible to test the timing margins of the DUT's receive circuitry. For this purpose, one might e.g. increase the amount of injected jitter while monitoring the bit error rate of the signal received by the second unit to be tested. The level margins of the second unit's receive path might e.g. be tested by varying the output levels of the conditioned first signal. Again, the bit error rate of the received signal might. e.g. be monitored in dependence on said output levels. This list of possible signal variations is not conclusive. The first signal might as well be modified in different ways before it is provided to the second unit to be tested.

Parameterized loop-back testing allows to considerably improve the test coverage. The additional hardware that is required for implementing a coupling unit according to an embodiment of the present invention is rather small. Hence, parameterized loop-back testing provides a good test coverage at low cost. Another advantage is that even high frequencies can be handled by the coupling unit, and therefore, the coupling unit is well suited for testing high-speed data links.

According to a preferred embodiment of the invention, the coupling unit is adapted for modifying the shape of a signal traveling on the first signal path, while the content of said signal is substantially preserved. Although the signal's properties might be varied, the signal received by the second unit to be tested can be compared with the signal sent by the first unit to be tested. Thus, it is possible to determine whether a faultless reception is still possible.

In a preferred embodiment of the invention, said parameters permit to set up and reprogram the transmission properties of the first signal path. By varying said parameters, the shape of the signal received by the second unit to be tested can be varied. Besides that, the signal quality may be intentionally degraded, in order to test the tolerance of the second unit's receive path.

In a preferred embodiment of the invention, the coupling unit's signal conditioning facility comprises a comparator. The first signal, or a signal derived therefrom, is provided to said comparator as an input-signal. Said input signal is compared with a threshold, whereby the threshold is set according to said predefined parameters. If the level of the input signal exceeds said threshold, a first output level will be obtained, and otherwise, a second output level will be obtained at the comparator's output. Said comparator allows to test the signal level of said first signal or of a signal derived therefrom. An at-speed level verification of said signal can be performed. The comparator unit is part of the signal conditioning facility and contributes to signal shaping and signal conditioning.

In a preferred embodiment of the invention, the signal conditioning facility comprises a delay unit, preferably a variable delay unit, adapted for introducing delay into signals traveling between the first and the second unit to be tested. The first and the second unit to be tested might e.g. be connected by a plurality of different signal paths. By applying such delay only to some of the signal paths or different delay to different signal paths, signals can be delayed with respect to each other, thus allowing testing e.g. susceptibility of the units to be tested with respect to time margins of the signals. In particular in case that variable delay units are applied, such time margins (such as e.g. set-up and hold times in digital signals) can be varied, for example, for verifying minimum time margins e.g. as specified for the units to be tested.

For the purpose of this embodiment, any type of delay unit can be applied. The applied delay unit(s) may be all of the same type, but also different types can be applied for different delay units. Preferably, delay unit(s) as disclosed in U.S. Pat. No. 6,127,871 by the same applicant can be used.

In one embodiment, a delay unit as disclosed in pending U.S. application Ser. No. 10/273950 (by the same applicant) is used. Such delay unit can be applied for providing an output signal delayed by a delay time with respect to a periodic signal received at its input, such as a clock signal. The delay unit comprises a first delay cell to receive the periodic signal and to provide as output a first delayed signal corresponding to the input periodic signal but delayed by a variable first delay time. A selection unit receives the first delayed signal and a second signal derived from the periodic signal. The selection unit selects one of the first delayed signal and the second signal as the output signal of the delay unit.

According to another embodiment of the invention, the coupling unit comprises a control unit adapted for controlling the delay induced by said delay unit. The control unit might e.g. provide a delay control signal to the delay unit. Said delay control signal might e.g. be a time-dependent signal adapted for varying the delay as a function of time. One might e.g. continuously increase the delay while checking whether the signal can still be received correctly.

According to another embodiment of the invention, at least one of a set-up time and a hold time of a data signal is varied by modifying the delay induced by the delay unit. The set-up time and the hold time are defined with respect to a clock signal. During the set-up time, the data signal is already valid, while the clock signal has not occurred yet. After the clock signal has occurred, the data signal remains valid for a period of time commonly referred to as the hold time. By varying the delay of the first signal path, the data signal is delayed relative to the clock signal, and both the set-up time and the hold time are modified. Typically, each unit to be tested is characterized by a minimum set-up time and a minimum hold time that specify the minimum requirements for a failure-free operation of the device. Only if both the data signal's set-up time and the data signal's hold time exceed said minimum set-up time and said minimum hold time, the conditioned first signal will be received correctly by the second unit to be tested. Otherwise, bit errors will occur. By varying the delay and monitoring the error rate, it is possible to determine both the minimum set-up time and the minimum hold time of the second unit's receive path.

In a preferred embodiment, a skew component is imposed upon the signal traveling on the first signal path. Said skew provides a time-independent contribution to the total delay of the first signal path.

In yet another preferred embodiment of the invention, a certain amount of jitter is imposed upon the signal traveling on the first signal path. Said jitter might e.g. be injected by modulating the delay of the first signal path in accordance with a jitter signal. By injecting jitter, the signal traveling on the first signal path can be intentionally degraded, thus rendering the possibility to evaluate susceptibility or sensibility with respect to jitter of the second unit to be tested. Applying different functions of the time relationship for the delay (such as e.g. sinusoidal, rectangular, triangular or other type of waveforms) allows to test various types of jitter signals or emulate different sources of jitter injection.

According to a preferred embodiment of the invention, the first signal path is adapted to provide a single-ended signal connection.

In an alternative preferred embodiment, the first signal received from the first unit to be tested is a differential signal, with said differential signal comprising a normal signal and a complementary signal that is complementary to the normal signal. If said first signal is transmitted as a differential signal, the impact of electromagnetic disturbances can be significantly reduced. For this reason, differential signal lines are well-suited for realizing high speed data links.

In a preferred embodiment, the first signal path comprises a differential input unit adapted for converting a differential signal received from the first unit to be tested into a single-ended signal. As soon as the differential signal has been converted into a single-ended signal, signal conditioning and signal shaping of said single-ended signal can be performed more easily, because only one signal has to be modified. Correspondingly, in another preferred embodiment of the invention, the first signal path comprises a differential output unit adapted for converting a single-ended input signal into a differential output signal. Said differential output signal is provided to the differential input of the second unit to be tested.

In a preferred embodiment, a common mode signal is derived from the differential signal. Said common mode signal, which is defined as the mean voltage of the normal signal and the complementary signal, might e.g. be derived by means of a voltage divider. The common mode signal might be routed, via the coupling unit, to an external channel. There, properties such as e.g. signal level, frequency components etc. of said common mode signal may be analyzed. Furthermore, the signal level of the common mode signal might be modified in various different ways by the signal conditioning facility.

For example, in a preferred embodiment, the signal conditioning facility might set the common mode signal to a predefined level, with said predefined level being selected in accordance with said predefined parameters. Alternatively or additionally, a time-dependent signal such as e.g. an arbitrary waveform signal or a noise signal might be superimposed onto the common mode signal, whereby parameters like e.g. the signal amplitude, the frequency, the noise level etc. might be set according to said predefined parameters. Then, the modified differential signal with a modified common mode level is forwarded to the second unit's receive path. There, the susceptibility to variations of the common mode level can be tested. In particular, the tolerance of the second unit's receive path to common mode noise injection can be determined.

According to a preferred embodiment, the first signal path comprises a drive unit. Said drive unit converts the first signal, or a signal derived therefrom, into an output signal of the required signal power. The driver allows to set the signal levels of the output signal to arbitrary signal levels, whereby said output signal levels may be set in accordance with said predefined parameters. By varying the signal levels of the output signal, the level tolerance of the DUT's receive path can be tested.

In a preferred embodiment, the first and the second unit to be tested are substantially complementary in function to each other. For example, one of the units to be tested might be a serializer adapted for serializing a multitude of data streams, while the other unit to be tested might be a deserializer.

The first and second units to be tested are preferably electronic devices, e.g. integrated or discrete circuits, but may also be other types of devices such as optical devices, etc. Further, in case of electronic devices, such devices are preferably digital devices, but may as well be analogue or mixed devices.

According to a preferred embodiment of the invention, the coupling unit is applied for loop-back testing between input (s) and output(s) of different functional units of the same device. In an alternative embodiment, the coupling unit is used for testing different devices that are physically separated from each other.

The coupling unit according to an embodiment of the present invention might e.g. be used for testing physical interfaces, and in particular for testing high-speed serial interfaces like e.g. PCI Express, HyperTransport, Serial ATA, Rapid IO, FibreChannel, Embedded SerDes, XAUI, etc. The coupling unit can be used for testing all kinds of interfaces, though.

In another preferred embodiment, the coupling unit comprises a wire loop adapted for bypassing the parameterized first signal path, and first switching facilities adapted for switching between the parameterized first signal path and said wire loop. The internal wire loop allows to perform a fast check of the functionality of the units to be tested without parameter tuning. Besides that, the wire loop allows to verify non-binary signal levels.

According to another preferred embodiment, the coupling unit comprises second switching facilities that allow to switch the signal path in a way that terminals of one of the units to be tested are connected with an external resource, in particular with an external channel. The external channel may e.g. determine the respective termination resistors of a drive path or of a receive path of a unit to be tested. Besides that, the external resource might be adapted for performing DC measurements, in order to determine e.g. output levels of the DUT's drive path. Furthermore, the external resource might e.g. be used for performing a functional vector test, or for at least one of generating or analyzing scan vectors. In case the drive path provides a differential signal to the coupling unit, the external resource might e.g. determine the signal level of the corresponding common mode signal.

In a preferred embodiment of the invention, the coupling unit comprises, in addition to the first signal path, a second signal path adapted for providing a signal connection between the second unit to the tested and the first unit to be tested. Said second signal path comprises a second signal conditioning facility. A second signal is received from the second unit to be tested, then, said second signal is conditioned by said second signal conditioning facility, and the conditioned signal is provided to the first unit to be tested. While the first signal path provides a connection from the first unit to the second unit, the second signal path corresponds to the opposite direction from the second unit to the first unit. Hence, this embodiment allows to test bidirectional interfaces like e.g. memory interfaces. For testing memory interfaces, both write and read accesses have to be performed.

In a testing system according to an embodiment of the present invention, a stimulus signal is provided to a first unit to be tested. The first unit to be tested is connected, via a coupling unit as described above, with a second unit to be tested. The response signal obtained from the second unit to be tested is analyzed by means of a signal analysis unit, whereby said signal analysis unit allows to determine whether the signal has been received correctly. For this purpose, the signal analysis unit might e.g. compare the receive signal with said stimulus signal. Alternatively, the signal analysis unit might perform a signature analysis, for example a CRC (Cyclic Redundancy Code) check, in order to verify whether the received signal is correct or not. Today's integrated circuits often comprise BIST (Built-In Self Test) capabilities. For example, the second unit to be tested might comprise a built-in signal analysis unit.

According to a preferred embodiment, the testing system further comprises a signal source, for example a pattern generator, that is adapted for generating said stimulus signal. In case of a BIST system, the signal source might be integrated on the first unit to be tested. For example, a PRBS (Pseudo-Random Bit Sequence) generator might be used for providing a pseudo-random bit sequence as a stimulus signal to the first unit to be tested.

The testing system allows to perform parameterized loopback testing: the signal received from the first unit to be tested is modified by said coupling unit in accordance with a set of predefined parameters, and the conditioned signal is forwarded to the second unit to be tested. There, the signal analysis unit determines whether a faultless reception of said conditioned signal is possible or not. The coupling unit's signal conditioning facility might e.g. be used for intentionally degrading the first signal until the conditioned first signal is no longer received correctly by the second unit's receive path.

For example, by imposing a certain amount of jitter upon the data signal, it is possible to test the timing margins of the second unit's receive circuitry. For this purpose, one might e.g. increase the amount of injected jitter while monitoring the bit error rate of the signal received by the second unit to be tested. When the amount of injected jitter becomes so large that the timing margins of the second unit's receive path are surpassed, the second unit's pattern analysis unit will start to report bit errors. The level margins of the DUT's receive path might e.g. be tested by varying the output levels of the coupling unit's driver circuits. Again, the bit error rate of the received signal might e.g. be monitored in dependence on said output levels. In case a differential signal is received from the DUT, a certain noise level might e.g. be superimposed upon the common mode voltage of said differential signal, in order to verify the level margins and the tolerance of the second unit's receive circuitry to noise. Alternatively, the level tolerance of the DUT's receive path might e.g. be tested by superimposing a signal of arbitrary waveform upon the common mode voltage.

The invention can be partly or entirely embodied or supported by one or more suitable software programs, which can be stored on or otherwise provided by any kind of data carrier, and which might be executed in or by any suitable data processing unit. Software programs or routines are preferably applied for controlling the transmission properties of the coupling unit's signal conditioning facility.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF EMBODIMENTS OF THE INVENTION

Figure 1:
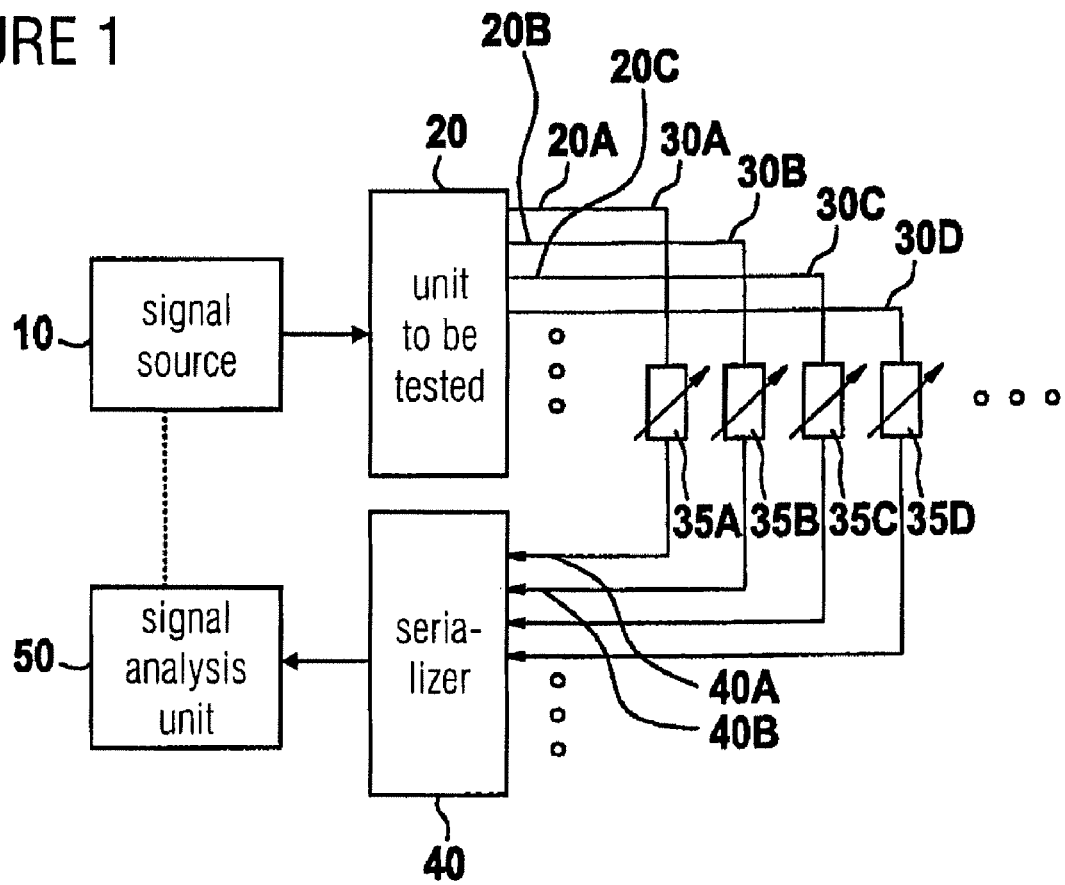
FIG. 1 shows a first embodiment of the present invention.

In FIG. 1, a first embodiment of the invention is shown. A signal source 10 provides a stimulus signal to an input of a first unit to be tested 20. In the example of FIG. 1, the unit 20 is a deserializer, deserializing a signal received at its input to a plurality of its outputs.

The outputs of the unit 20 are coupled via signal paths 30A, 30B, 30C, etc. with corresponding inputs of a second unit to be tested 40. In the example of FIG. 1, the unit 40 shall be a serializer for serializing the signal received at its input and providing the serialized signal at its output. Devices such as serializer and deserializer are well known in the art and need not to be detailed herein.

The output of the unit 40 is provided to a signal analysis unit 50. The signal analysis unit 50 analyzes the received signals, preferably by comparing the received response signals with expected response signals expected to receive in response to the applied stimulus signals. Such expected response signals might be derived from the signal source 10, as indicated by the dotted line, but can also be already stored in the analysis unit 50.

At least one of the signal paths 30 comprises a delay unit 35 for delaying signals traveling on the signal path 30. In the example of FIG. 1, each signal path 30i comprises a respective delay unit 35i (with i=A, B, C, . . . ). The plurality of signal paths 30 together with their respective delay lines 35 represent a coupling unit 60 for coupling between the units 20 and 40.

Figure 2:
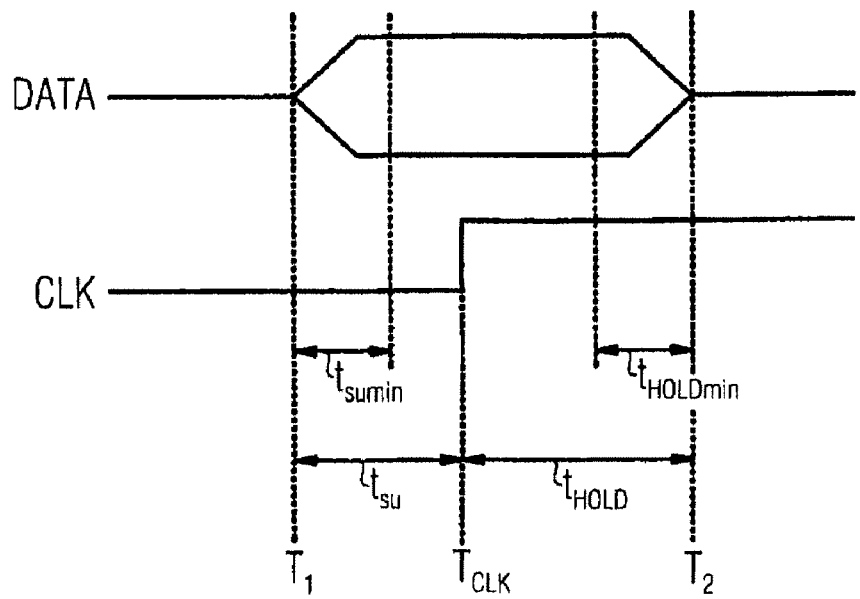
FIG. 2 depicts a timing chart for a data signal and a clock signal.

An application for testing the first and second units 20 and 40, e.g. as of FIG. 1, shall now be illustrated with respect to FIG. 2. The upper part in FIG. 2 shows a data signal DATA, which becomes valid at a point in time $T_1$ and remains valid until a point in time $T_2$. A clock signal CLK in the lower part of FIG. 2 has a rising edge at a point in time $T_{CLK}$.

The time difference between $T_{CLK}$ and $T_1$ is usually referred to as setup time $t_{SU}$, representing the time wherein the data signal DATA is valid until the clock signal CLK appears. Accordingly, the time between $T_2$ and $T_{CLK}$ is usually referred to as hold time $t_{HOLD}$, representing the time after the clock signal CLK appears and-the data signal DATA is still valid.

Typically, each device to be tested has a specified minimum setup time $t_{SUmin}$ and a minimum hold time $t_{HOLDmin}$ as specified for example by the manufacturer of the device. Such specified minimum setup time $t_{SUmin}$ and minimum hold time $t_{HOLDmin}$ represent the specified minimum requirements for the application of valid signals, so that failure free operation of the device can be specified.

Using the example of FIG. 1, the output 20A of the unit 20 shall provide the clock signal CLK to the input 40A of the unit 40. Accordingly, the output 20B of the unit 20 shall provide the data signal DATA to the input 40B of the unit 40. For the sake of simplicity, only one such data signal shall be regarded here, however, it goes without saying that multiple such data signals can also be transmitted between the units 20 and 40.

Varying the point in time $T_{CLK}$ with respect to the timings $T_1$ and $T_2$ can be accomplished by providing a delay with either one or both the delay units 35A and 35B. Thus, by varying the delay the specified minimum setup and hold times $t_{SUmin}$ and $t_{HOLDmin}$ can be verified.

In a preferred embodiment, a start timing is selected so that the unit to be tested is assumed to work properly and without failures. A functional test is then provided by comparing the received data with expected data. The timing is then varied in one or more steps until a predefined value, preferably the minimum setup or hold time $t_{SUmin}$ and $t_{HOLDmin}$, and the test is repeated. The test might be abandoned in case a failure is detected. The test might also then be repeated into the opposite timing direction.

Instead of testing setup and hold time or in addition thereto, jitter can be applied by varying the delay over the time. Preferably, an arbitrary waveform generator controls the delay of one or more of the delay units 35, thus allowing to modulate the delay with any arbitrary waveform in order to induce the various types of jitter. This allows to check immunity of the receiver against jitter.

While the units to be tested 20 and 40 can be physically separated individual devices, they may also be physically arranged on one device. Further, the units 20 and 40 preferably have complementary function as e.g. the example of FIG. 1 with deserializing and serializing.

It is clear that any other type of units 20 and 40 can be applied for the testing according to the present invention. Typical other examples are to provide the coupling unit 60 between the serial output of a serializer and the serial input of a deserializer (e.g. communication devices), between the output and the input of flip-flops, between the output and the input of computer buses like S-ATA, Hyper Transport, PCI Express, etc.

Figure 3:
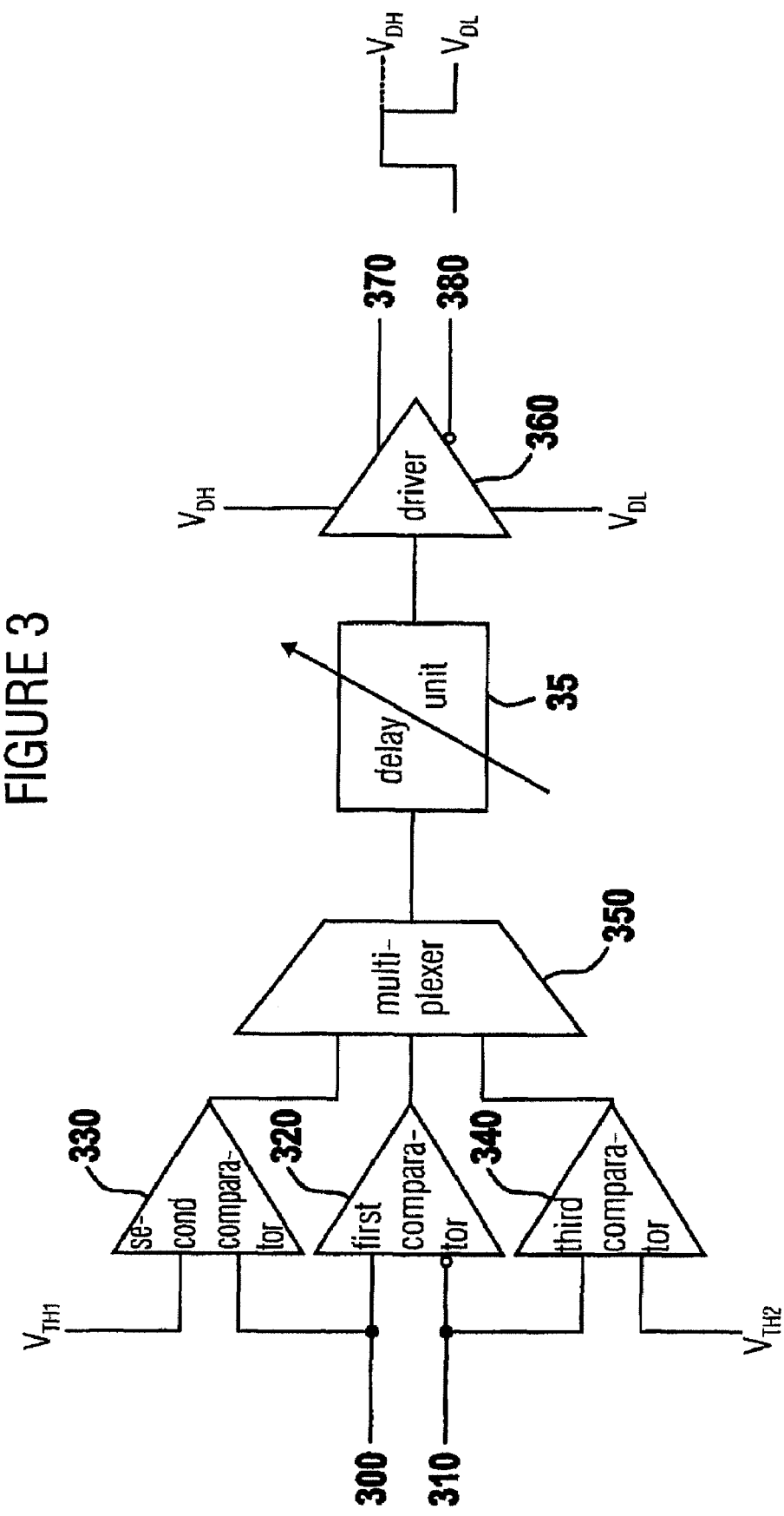
FIG. 3 shows a signal path adapted for providing a differential signal connection.

FIG. 3 shows an embodiment for the signal path 30 allowing to apply single-ended signals as well as differential signals. An input line 300 (as provided e.g. form unit 20) is applied to inputs of a first comparator 320 and a second comparator 330. A second input line 310 is provided to an inverting input of the first comparator 320 and to an input of a third comparator 340. The second comparator 330 receives as second input a threshold voltage $V_{TH1}$, and the third comparator 340 receives as second input a threshold voltage $V_{TH2}$.

Outputs of the three comparators 320 to 340 are provided to a multiplexer 350 allowing to select and couple one of its input as its output. The output of the multiplexer 350 is provided to the delay unit 35, which can be a variable delay unit. The delayed output of the delay unit 35 is provided to the input of a driver 360 having a normal output 370 and an inverted output 380. Outputs 370 and 380, or only one of them, can then be applied to the unit 40. Control voltages $V_{DH}$ and $V_{DL}$ allow setting the output levels of the output signals on lines 370 and 380, as indicated by the levels of the example of a logic signal on the very right side in FIG. 3.

In case that a differential signal, i.e. a normal signal and a complementary signal being complementary to the normal signal, is applied at the lines 300 and 310, the comparator 320 provides a combined single-ended signal by subtracting the normal and the complementary signal. The signal on line 300 is further compared with the threshold voltage $V_{TH1}$, and the comparator 330 provides a first logical level as long as the signal on line 300 exceeds the threshold voltage and a second logical level as long as the signal on line 300 is below the threshold voltage. Accordingly, the third comparator 340 provides a first logical level as long as the signal on line 310 exceeds the threshold voltage $V_{TH2}$ and a second logical level as long as the signal on line 310 is below the threshold voltage. Applying the threshold voltages $V_{TH}$, in particular as variable voltages, allows to test the levels of the signals applied on either one of the lines 300 and 310.

Dependent whether one of the differential signals or their combined subtraction signal is to be tested as single-ended, signal, the multiplexer 350 selects one of the outputs of the comparators 320 to 340. The delay unit 50 can then apply a delay to the selected signal. The driver 360 drives the signal received from the delay unit 35, whereby the output levels $V_{DL}$ and $V_{DH}$ can be set by applying the respective voltages to the driver 360. The output of the driver 360 is a differential signal with the signal on line 380 representing the inverted (complementary) signal on line 370.

In case that a single-ended signal is applied on either one of the input lines 300 or 310, the aforesaid applies accordingly, and the multiplexer 350 selects the adequate signal.

While the comparators 330 and 340 allow to test the signal levels at the input lines 300 and 310, the driver 360 allows to modify the output levels and the output lines 370 and 380. Accordingly, the comparators 330 and 340 allow testing the output levels of the output of the first unit to be tested 20, whereas the input level of the second unit under test 40 can be tested using the driver levels $V_{DH}$ and $V_{DL}$.

Figure 4:
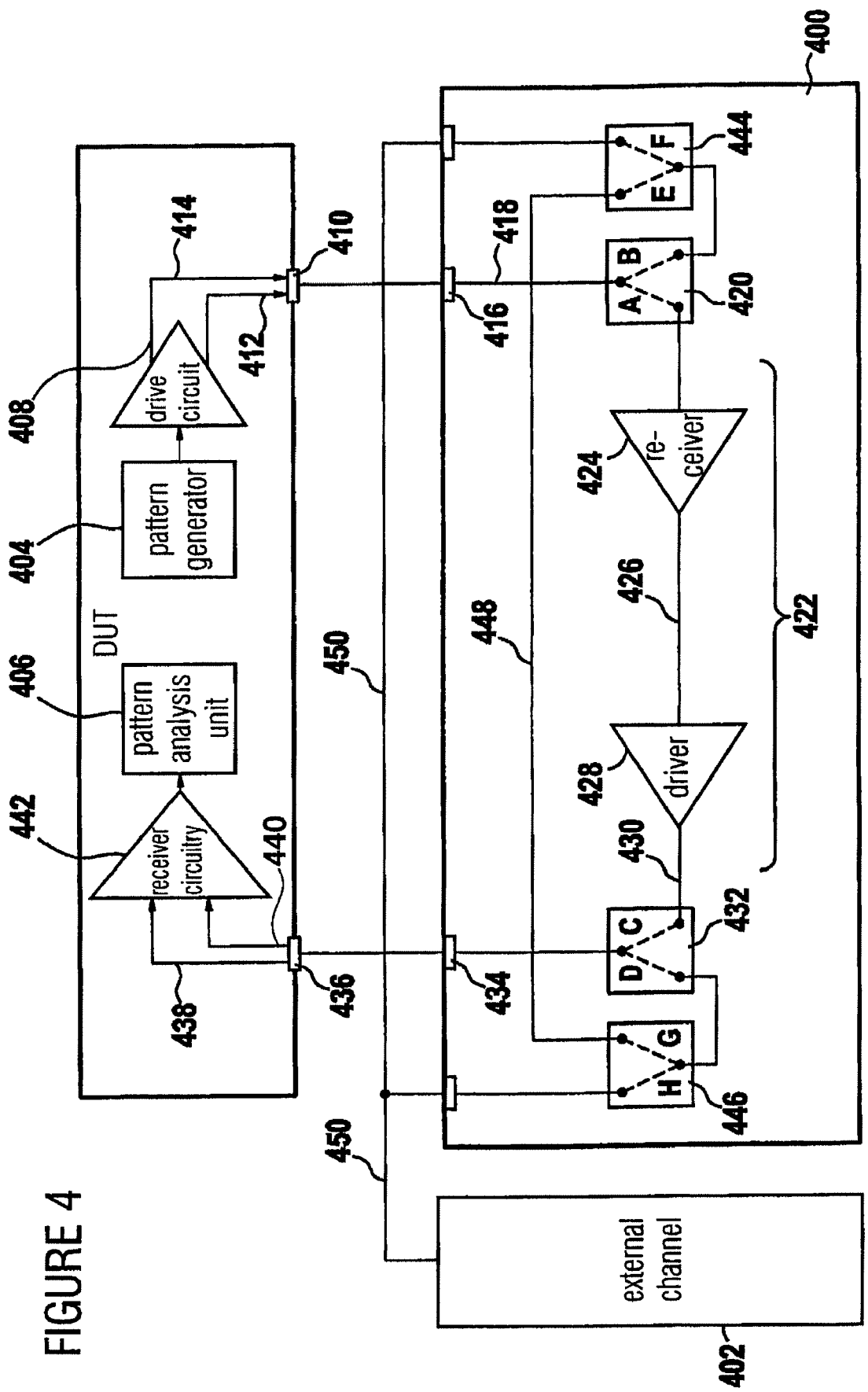
FIG. 4 shows a further embodiment of the present invention.

In FIG. 4, another embodiment of the present invention is shown. The set-up comprises a DUT, a coupling unit 400, and an external channel 402. The DUT comprises capabilities for performing a built-in self test (BIST). In particular, the DUT comprises a pattern generator 404 and a pattern analysis unit 406. The pattern generator 404 is adapted for providing test patterns to the DUT's drive circuit 408. The pattern generator 404 might e.g. be a Pseudo-Random Bit Sequence (PRBS) Generator. Alternatively, the pattern generator 404 might e.g. provide predefined test patterns to the DUT's drive circuit 408. The drive circuit 408 is adapted for providing a DUT output signal at the interface 410. Said DUT output signal might be either a differential signal or a single-ended signal. In the embodiment shown in FIG. 4, the DUT output signal is realized as a differential signal comprising a normal signal 412 and a complementary signal 414.

The unidirectional interface 410 might e.g. be a serial port that allows to establish high-speed data links with data rates of 1.5 Gbps and beyond. Examples for high-speed serial interfaces comprise PCI Express (2.5 Gbps) HyperTransport (1.6 Gbps), Serial ATA (S-ATA, 1.5 Gbps), Rapid IO, Fibre-Channel, Embedded SerDes, XAUI, etc. The present invention is not restricted to high-speed serial ports, though. Embodiments of the present invention can be used for testing all kinds of digital and analogue interfaces.

The unidirectional interface 410 is connected with a port 416 of the coupling unit 400. The port 416 is connected, via at least one signal line 418, with a relay 420. If the relay 420 is set to the position A, the port 416 will be connected with the signal conditioning path 422. The signal conditioning path 422 comprises a receiver 424 that compares the level of the input signal with a predefined threshold. The signal 426 obtained at the receiver's output is forwarded to the driver 428. At the output of the driver 428, a modified signal 430 is obtained. If the relay 432 is set to a position C, the modified signal 430 will be routed to a port 434 of the coupling unit 400. The port 434 is connected with an interface 436 of the DUT. If a differential signal has been provided to the coupling unit 400, the coupling unit will also provide a differential signal to the interface 436 of the DUT, with said differential signal comprising a normal signal 438 and a complementary signal 440.

The signal received from the coupling unit 400 is evaluated by the DUT's receive path. In FIG. 4, the receive path (Rx) comprises receive circuitry 442 and a pattern analysis unit 406. By comparing the received pattern with the pattern initially generated by the pattern generator 404, it can determined whether bit errors have occurred or not. Alternatively, the pattern analysis unit 406 might carry out a CRC (Cyclic Redundancy Code) analysis. CRC information transmitted within the data stream is compared with CRC information derived from the received pattern, and in case of a mismatch, the data has obviously not been received correctly.

The signal conditioning path 422 allows to modify a signal received from the DUT in accordance with predefined parameters. For example, the signal conditioning path 422 might comprise means for verifying received signal levels, for injecting jitter, for superimposing noise, for introducing additional delays, for checking the signal integrity, for adjusting the signal's voltage levels, etc. In particular, the signal's properties may be purposely degraded before the modified signal is transmitted back to the DUT. On the part of the DUT, the pattern analysis unit 406 allows to determine whether the received signal may still be decoded correctly, or whether bit errors are induced by the stress exerted on the signal.

The coupling unit 400 might further comprise two additional relays 444 and 446. If the relays 420 and 444 are set to the positions A, E and the relays 446 and 432 are set to the positions G, D, the port 416 will be connected via the internal wire loop 448 with the port 434. Hence, the signal conditioning path 422 will be bypassed by the internal wire loop 448. This allows for a fast check of the DUT's functionality, whereby the parameters of the signal conditioning path 422 do not have to be specified. Furthermore, non-binary signal levels may be verified by means of the internal wire loop 448.

The coupling unit 400 shown in FIG. 4 further allows to connect external equipment to at least one of the DUT's interfaces 410 and 436. For example, by setting the relays 420 and 444 to the positions D and F, the DUT's drive path (Tx) may be connected, via the relays 420, 444 and the at least one signal line 450, with the external channel 402, which might e.g. be an ATE card or an instrument. The external channel 402 might e.g. be used for performing DC measurements. In particular, the external channel 402 might e.g. measure the static level of the DUT output signal, the termination of the drive path, etc. In case the DUT's drive path provides a differential signal, the common mode voltage of said differential signal might be measured by the external channel 402. Furthermore, the external channel 402 might be adapted for monitoring the signal integrity, for performing functional vector tests, etc. In case the DUT comprises a scan chain, a scan pattern might be obtained at the DUT's output, and said scan pattern might be analyzed by the external channel 402.

If the relays 432 and 446 are set to the positions D and H, the external channel 402 will be connected, via the at least one signal line 450 and the relays 446, 432, with the receive path of the DUT. The external channel 402 might e.g. be used for measuring the termination of the DUT's receive path. In case the DUT comprises a scan chain, the external channel 402 might be used as a scan resource, whereby scan vectors generated by the external channel 402 are provided to the DUT's receive path.

Figure 5:
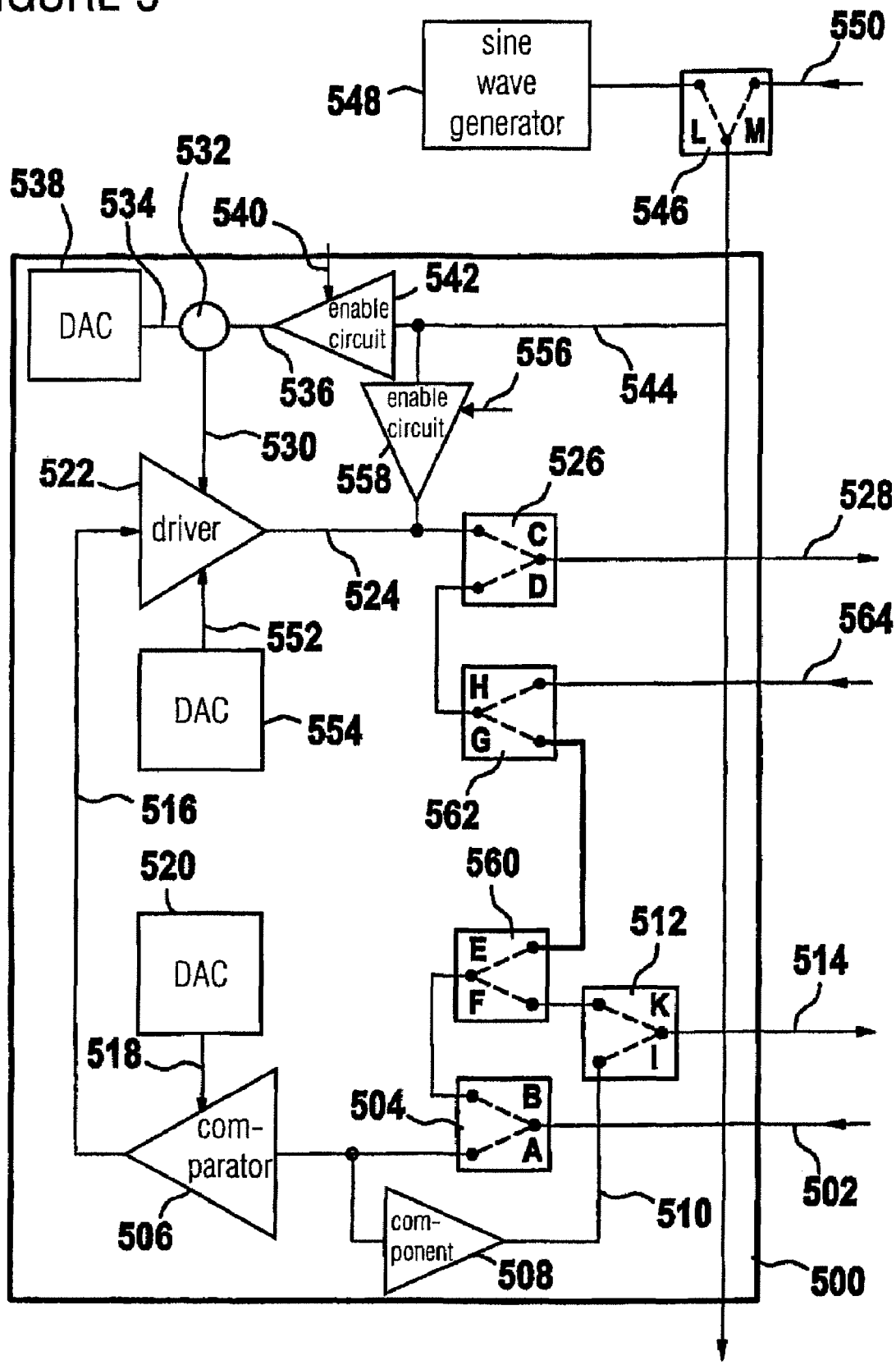
FIG. 5 gives a more detailed view of a coupling unit.

FIG. 5 gives a more detailed view of a coupling unit 500. The input signal 502 is provided by the DUT's drive path. If the relay 504 is set to position A, the input signal 502 will be forwarded, via said relay 504, to the comparator 506. The comparator 506 receives the respective input signal 502 and generates a signal 516. In case the input signal 502 is a single-ended signal, the input signal's level is compared with a predefined threshold. In case the input signal 502 is a differential signal, the comparator 506 might generate the signal 516 by subtracting the normal and the complementary signal. Alternatively, the comparator 506 might compare either one of said two signals with a predefined threshold. The required analogue threshold value 518 might be generated by a digital/analogue converter 520. The respective setting of the threshold levels allows to analyze the output levels of the DUT's drive path.

In case the input signal 502 is a differential signal, it might be advantageous to determine the common mode voltage of said differential signal. For this purpose, the differential signal might be provided to a component 508 adapted for deriving a common mode signal 510, whereby the signal level of said common mode signal 510 is defined as the mean value of the normal and the complementary signal level of the differential signal. In case the relay 512 is set to the position J, the common mode signal 510 can be routed, via the signal line 514, to an external channel, or to another kind of measurement unit. There, the input signal's common mode voltage can be determined.

The signal 516 is forwarded to a driver 522. The driver 522 is adapted for deriving, from said signal 516, an output signal 524 with predefined output levels. Besides that, the driver 522 might act as a variable delay element adapted for introducing a variable time delay into the signal conditioning path, with said variable delay being controlled by the delay control signal 530. If the relay 526 is set to position C, the driver's output signal 524 will be provided, via the signal line 528, to the receive path of the DUT.

Figure 6:
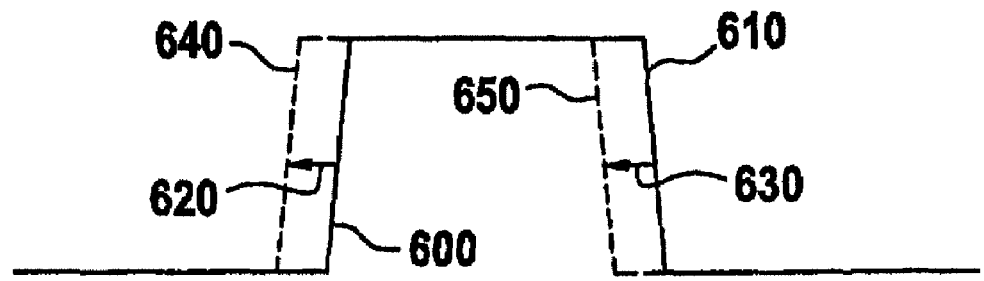
FIG. 6 shows a signal that is subjected to a delay.

In FIG. 6, a rising edge 600 and a falling edge 610 of the signal 516 are shown. Within the driver 522, the edges 600, 610 are subjected to an additional delay, as indicated by the arrows 620, 630. At the output of the driver 522, the output signal 524 is obtained. The rising edge 640 and the falling edge 650 of said output signal 524 are also shown in FIG. 6.

The extent of the additional delay is determined by the magnitude of the delay control signal 530 that is provided by the adder 532. Said adder 532 is adapted for summing up the signal levels of two contributing signals 534 and 536. The signal 534 is provided by a digital/analogue converter 538. The signal 534 is related to a constant contribution to the delay that will further on be referred to as "skew".

If the inject enable signal 540 of the enable circuit 542 is set, the time-dependent signal 544 will be provided, as a signal 536, to the adder 532. The time-dependent signal 544 is related to a time-dependent contribution to the delay that will further on be referred to as "jitter". If the relay 546 is set to the position L, the time-dependent signal 544 will be supplied by an internal sine wave generator 548. The delay will be modulated by a sinusoidal jitter signal, and hence, jitter can be imposed on the driver's output signal 524. If the relay 546 is set to the position M, the time-dependent signal 544 will be supplied, via the signal line 550, by an external Arbitrary Waveform Generator (AWG). In this case, the delay might be modulated by any arbitrary waveform in order to induce various different types of jitter. Thus, the tolerance of the DUT's receive path to different kinds of jitter may be tested.

The driver 522 is capable of setting the signal levels of the output signal 524 to any desired set of signal levels. The respective levels can be defined by means of one or more analogue signals 552 provided by a digital/analogue converter 554. By varying the programmable levels of the output signal 524, the level margins of the DUT's receive circuitry may be tested.

Furthermore, a time-dependent signal component might be superimposed upon the output signal 524. If the inject enable signal 556 of the enable circuit 558 is set, the time-dependent signal 544 will be superimposed upon the output signal 524. The time-dependent signal 544 might be a sinusoidal signal provided by the internal sine wave generator 548, a signal of arbitrary waveform provided by an external AWG, etc. Alternatively, a noise signal might be superimposed on the output signal 524. Said noise signal might be injected via the signal line 550, the relay 546 and the enable circuit 558.

In case the output signal 524 is a differential signal, it might be desirable to modify the common mode level before the differential signal is forwarded to the DUT. In order to superimpose any kind of time-dependent signal upon the common mode signal, the respective sinusoidal signal, arbitrary waveform signal, noise level, etc. might e.g. be superimposed on both the normal and the complementary signal component of the differential signal. This allows to test the tolerance of the DUT's receive path to common mode signal injection.

The relays 504, 526, 560, 562 shown in FIG. 5 correspond to the relays 420, 432, 444, 446 of FIG. 4. Said relays permit to switch the signal path in a way that the input signal 502 is directly routed to the signal line 528. Furthermore, the input signal 502 may be routed, via the relays 504, 560, 512 and the signal line 514, to an external resource, e.g. to an external channel. Besides that, a signal received from an external resource might be routed, via the signal line 564, the relays 562, 526 and the signal line 528, to an input of the DUT. Instead of relays, any other kind of switching means (e.g. multiplexers) might be used as well.

The coupling unit 500 does not comprise a dedicated clock. Instead, the input signal 502 is clocked through the coupling unit by the clock of the DUT's drive circuitry. Then, the coupling unit's output signal is provided, via the signal line 528, to the receive circuitry (Rx) of the DUT. There, the receive clock is adjusted to the signal received from the coupling unit. For example, a phase-locked loop (PLL) might be used for tracking the phase of the received signal. In case a certain amount of jitter is imposed upon the coupling unit's output signal, the DUT's receive circuits might not be able to track the clock variations any more. For example, the frequency of the jitter might be in the order of magnitude of one tenth of the signal's clock frequency, and accordingly, the clock variation might be too fast to be tracked by the receive circuits. Hence, by injecting a certain amount of jitter, the signal quality can be intentionally degraded until a proper reception is not possible anymore, and the receiving circuit's tolerance to jitter can be tested.

Figure 7:
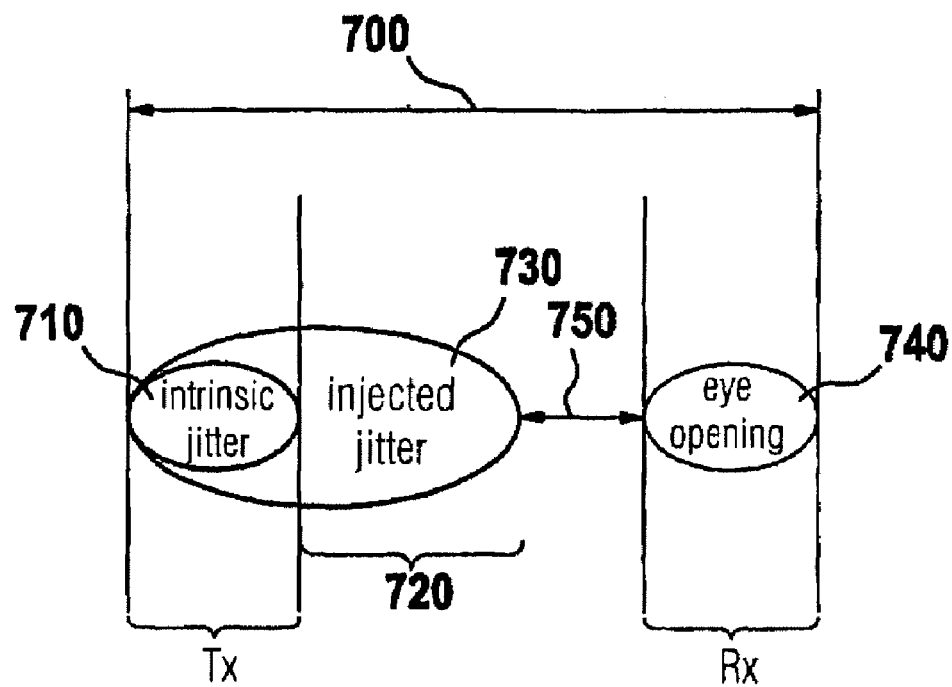
FIG. 7 shows the impact of jitter on signal reception.

In FIG. 7, one clock cycle 700 of the received signal is shown. As the clock of the DUT's drive circuitry is not perfectly stable, the input signal 502 of the coupling unit 500 might already comprise a certain amount of intrinsic Tx jitter 710. In the driver 522, an additional amount of injected jitter 720 is intentionally imposed, and as a result, an output signal 524 with a total amount of jitter 730 is obtained. The clocking of the coupling unit's output signal 524 will dither according to the total amount of jitter 730. The output signal 524 is provided to the DUT's receive path. On the part of the DUT's receive circuitry, signal reception can be represented by means of an eye diagram. In FIG. 7, the minimum eye opening 740 of the DUT's receive path is depicted. In order to make sure that the data signal is received correctly, the total amount of jitter 730 must not overlap with the minimum eye opening 740. In the case shown in FIG. 7, the total amount of jitter 730 does not overlap with the minimum eye opening 740 yet; there remains ascertain margin 750. By increasing the amount of injected jitter 720, the margin 750 is decreased, and at a certain point, the total amount of jitter 730 will start to overlap with the minimum eye opening 740. At this point, the total amount of jitter 730 is so large that the correspondence between data bits and clock cycles is lost. A safe reception is not possible anymore, and the pattern analysis unit of the DUT's receive path starts to report bit errors.

Figure 8:
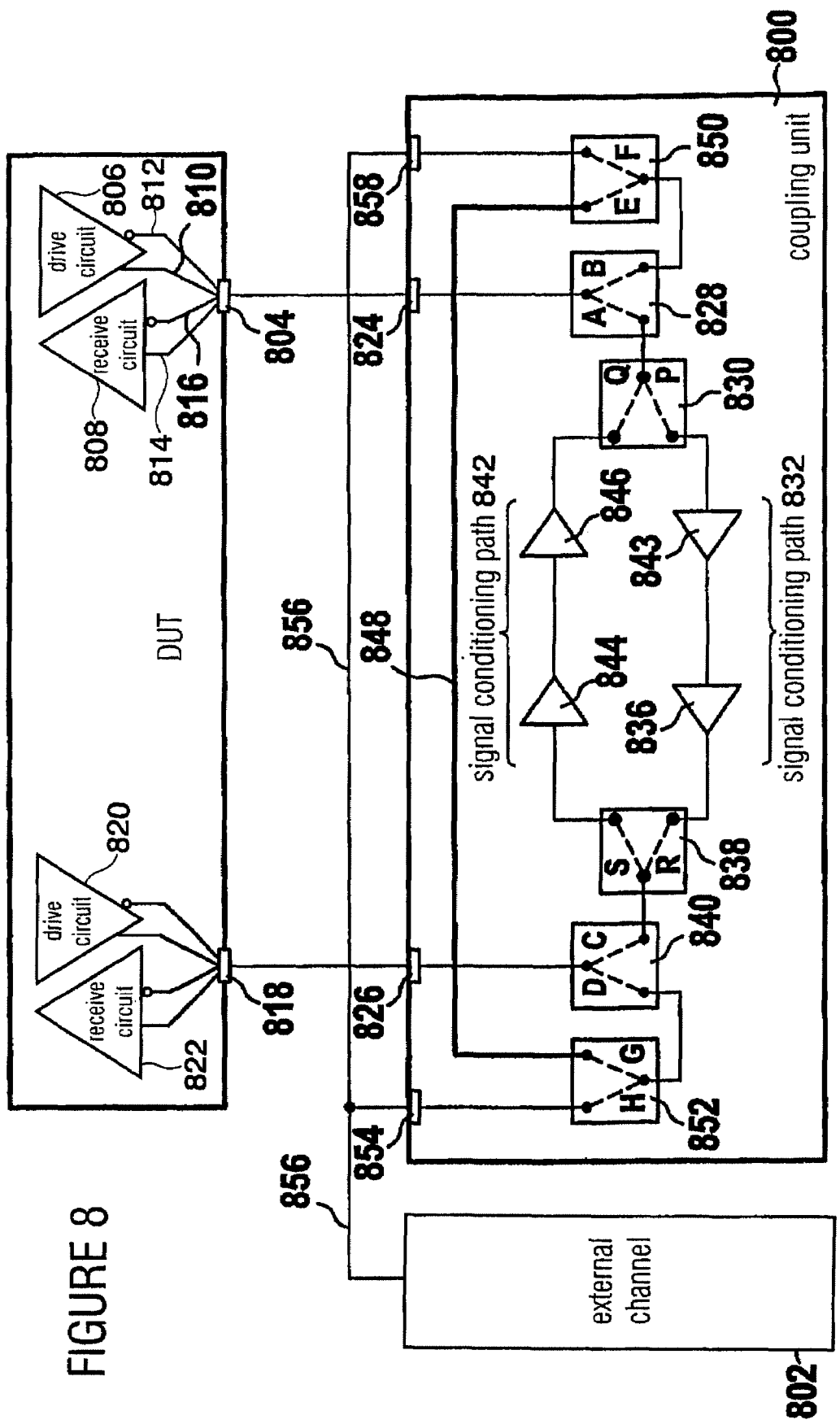
FIG. 8 shows another embodiment of the present invention.

FIG. 8 shows another embodiment of the present invention. The concept of parameterized loop-back testing can be applied to bidirectional interfaces as well. Hence, it is possible to test e.g. memory interfaces, because for testing memory interfaces, both write and read accesses have to be performed. The testing system shown in FIG. 8 comprises a DUT, a coupling unit 800 and an external channel 802. A drive circuit 806 and a receive circuit 808 are connected to the bidirectional interface 804. The drive circuit 806 is adapted for providing a differential output signal to the bidirectional interface 804, with said differential output signal comprising a normal signal 810 and a complementary signal 812. The receive circuit 808 is adapted for receiving a differential input signal from the bidirectional interface 804, with said differential input signal comprising a normal signal 814 and a complementary signal 816. Similarly, the bidirectional interface 818 is connected both to a drive circuit 820 and to a receive circuit 822.

For testing the DUT, the bidirectional interface 804 is connected with the port 824, and the bidirectional interface 818 is connected with the port 826 of the coupling unit 800. By setting the relays 828, 830 to the positions A and P, a DUT output signal can be routed from the port 824 to the first signal conditioning path 832. There, said signal might be subjected to signal shaping and signal conditioning. Said first signal conditioning path 832 might e.g. comprise a first receiver 834 and a first driver 836. At the output of the first driver 836, a modified signal is obtained. If the relays 838, 840 are set to the positions R and C, said modified signal will be provided, via the port 826 and the bidirectional interface 818, to the DUT's receive circuit 822. There, the received signal might be analyzed.

The drive circuit 820 might as well provide a DUT output signal at the bidirectional interface 818. In case the relays 840, 838 are set to the positions C and S, said signal is routed to the second signal conditioning path 842. The second signal conditioning path 842 comprises a second receiver 844 and a second driver 846. The modified signal that is obtained at the second drivet's output might be routed, via the relays 830, 828 and the port 824, to the bidirectional interface 804. There, the receive circuit 808 is responsible for further signal processing.

The coupling unit 800 further comprises an internal wire loop 848. If the relays 828, 850 are set to the positions B and E, and the relays 840, 852 are set to the positions D and G, the signal conditioning paths 832, 842 will be bypassed by the internal wire loop 848. Hence, a direct signal connection is established between the bidirectional interfaces 804 and 818. The drive circuit 806 may transmit signals via the internal wire loop 848 to the receive circuit 822, and in the opposite direction, the drive circuit 820 may transmit signals back to the receive circuit 808. This allows for a fast check of the DUT's functionality. In particular, critical bidirectional transitions may be verified. In case memory interfaces are tested, the internal wire loop 848 permits to verify at-speed read/write transitions that might e.g. be induced by state machine transitions within the DUT.

The coupling unit 800 further provides a possibility for routing DUT output signals to the external channel 802. For example, if the relays 840, 852 are set to the positions D and H, the bidirectional interface 818 will be connected, via the port 826, the relays 840, 852, the port 854 and the at least one signal line 856, with the external channel 802. The external channel might e.g. perform a DC parameter test, in order to determine the static level and the termination of the bidirectional interface 818. Besides that, the external channel 802 might be used as an external scan resource adapted, for at least one of: providing scan vectors to and receiving scan vectors from the bidirectional interface 818. Furthermore, the external channel 802 might e.g. be used for performing a functional vector test.

The bidirectional interface 804 might as well be connected with the external channel 802. For this purpose, the relays 828, 850 are set to the positions B and F. Thus, the bidirectional interface 804 will be connected, via the port 824, the relays 828, 850, the port 858 and the at least one signal line 856, with the external channel 802. Then, the above mentioned measurements may be performed with respect to the bidirectional interface 804.

What is claimed is:

1. A coupling unit for coupling a first and a second unit to be tested,
    said coupling unit comprising a first signal path providing a signal connection between at least one terminal of the first unit to be tested and at least one terminal of the second unit to be tested;
    with said first signal path comprising a signal conditioning facility receiving a first signal from the first unit to be tested, conditioning said first signal in accordance with predefined parameters, and providing the conditioned first signal to the second unit to be tested;
    said coupling unit further comprising a second signal path providing a signal connection between the at least one terminal of the second unit to be tested and the at least one terminal of the first unit to be tested, the signal connection receiving a second signal from the second unit to be tested and providing the second signal to the first unit to be tested; and
    first switching facilities switching the signal path to select a signal of said first signal path or said second signal path.

2. The coupling unit of claim 1, comprising at least one of the features:
    said first signal path substantially preserves the first signal's information content;
    the transmission properties of the first signal path are determined by said predefined parameters;
    said first signal is implemented as a single-ended signal.

3. The coupling unit of claim 1, said signal conditioning facility comprising a comparator unit comparing said first signal, or a signal derived therefrom, with a predefined threshold level, to set said threshold level in accordance with said predefined parameters.

4. The coupling unit of claim 1, said signal conditioning facility comprising a delay unit, preferably a variable delay unit, adapted to provide a delay for a signal traveling on the first signal path.

5. The coupling unit of claim 4, comprising at least one of the features:
    the coupling unit further comprises a control unit controlling the delay of said delay unit;
    the coupling unit further comprises a control unit controlling the delay of said delay unit by applying a control signal for modifying the delay over the time;
    the delay induced by said delay unit is controlled in order to vary at least one of a set-up time and a hold time of a digital data signal, the set-up time representing a time between a start of a valid data signal and a start of a valid clock signal, and the hold time representing a time between the start of the valid clock signal and an end of the valid data signal.

6. The coupling unit of claim 1, wherein skew is imposed on the first signal by setting the delay of the first signal path according to a skew signal, with said skew being imposed in accordance with said predefined parameters.

7. The coupling unit of claim 1, wherein jitter is imposed on the first signal by modulating the delay of the first signal path according to a jitter signal, with said jitter being imposed in accordance with said predefined parameters.

8. The coupling unit of claim 1, wherein said first signal path provides a single-ended signal connection.

9. The coupling unit of claim 1, wherein said first signal path provides a differential signal connection for transmitting a differential signal comprising a normal signal and a complementary signal being complementary to the normal signal.

10. The coupling unit of claim 9, comprising at least one of the features:
    the first signal path comprises a differential input unit receiving the differential signal and providing as output a single-ended signal representing one of: the normal signal or a signal derived therefrom, the complementary signal or a signal derived therefrom, or a difference signal as the signal difference between the normal signal, or a signal derived therefrom, and the complementary signal, or a signal derived therefrom;
    the first signal path comprises a differential output unit deriving, from its input signal, a differential output signal, and providing the differential output signal to the second unit to be tested;
    the signal conditioning facility deriving a common mode signal from the differential signal;
    the signal conditioning facility deriving a common mode signal from the differential signal and providing at least one of:

setting the common mode signal to a predefined level, with said predefined level being set in accordance with said predefined parameters, and superimposing, in accordance with said predefined parameters, at least one of an arbitrary waveform and a noise signal onto the common mode signal.

11. The coupling unit of claim 1, said signal conditioning facility comprising a driver adapted for transforming said first signal, or a signal derived therefrom, into an output signal with at least one output level, to set said at least one output level in accordance with said predefined parameters.

12. The coupling unit of claim 1, comprising at least one of the features:
the second unit to be tested is substantially complementary in function to the first unit to be tested;
the first and second units to be tested are comprised by either one device or each by a different device;
the coupling unit is a loop-back unit;
at least one of the units to be tested comprises a physical interface, in particular a serial interface such as PCI Express, HyperTransport, Serial ATA, Rapid IO, Fibre-Channel, Embedded SerDes, XAUI, with at least one of the terminals of the units to be tested being part of said physical interface.

13. The coupling unit of claim 1, comprising second switching facilities switching between said first signal path and a wire loop adapted for bypassing the signal conditioning facility of the first signal path.

14. The coupling unit of claim 1, comprising third switching facilities switching the signal path in a way that at least one terminal of one of the units to be tested is connected with an external resource.

15. The coupling unit of claim 1, the second signal path comprising a second signal conditioning facility receiving a second signal from the second unit to be tested, conditioning said second signal in accordance with predefined parameters, and providing the conditioned second signal to the first unit to be tested.

16. A testing system for testing at least one of a first and a second unit to be tested, comprising
at least one coupling unit of claim 1 coupled between the first and the second unit to be tested, and
a signal analysis unit analyzing a response signal received from the second unit to be tested in response to a stimulus signal provided to the first unit to be tested.

17. The testing system of claim 16, further comprising a signal source providing the stimulus signal to the first unit to be tested.

18. The testing system of claim 16, said signal conditioning facility degrading the first signal traveling on said first signal path until the conditioned first signal is no longer correctly received by the second unit to be tested.

19. The testing system of claim 18, said first signal conditioning facility degrading the first signal traveling on said first signal path by at least one of:
varying the at least one output level of the conditioned first signal;
varying the amount of jitter imposed upon the first signal;
varying the amount of skew imposed upon the first signal;
varying a common mode signal's noise level;
varying an arbitrary waveform signal imposed upon a common mode signal.

20. The coupling unit of claim 1, comprising:
one or more of said first signal path providing a signal connection between an output of the first unit to be tested and an input of the second unit to be tested, wherein at least one of the one or more signal paths comprises a delay unit adapted to provide a delay for a signal traveling on the signal path.

21. The coupling unit of claim 20, comprising at least one of the features:
wherein at least one delay unit is a variable delay unit providing a variable delay for the signal traveling on the signal path;
the coupling unit further comprising a control unit controlling the delay of one or more of the delay units;
the second unit to be tested being substantially complementary in function to the first unit to be tested;
the coupling unit further comprising:
one or more data signal paths, each coupled between a data output of the first unit to be tested and a data input of the second unit to be tested, the data output providing a data signal and the data input receiving the provided data signal,
a clock signal path between a clock output of the first unit to be tested and a clock input of the second unit to be tested, the clock output providing a clocking signal to be received by the clock input for clocking one or more of the received data signals, at least one of the clock signal path and the one or more data signal paths comprising the delay unit;
wherein the first and second units to be tested are comprised by either one device or each by a different device;
wherein the coupling unit is a loop-back unit.

22. A method for testing operation of at least one of a first and a second unit to be tested, said method comprising:
receiving a first signal from the first unit to be tested;
conditioning the first signal in accordance with predefined parameters to preserve the first signal's information content;
providing the conditioned first signal as an input signal to the second unit to be tested;
receiving a second signal from the second unit to be tested;
conditioning the second signal in accordance with predefined parameters; and
providing the conditioned second signal as an input signal to the first unit to be tested.

23. The method of claim 22, comprising applying a stimulus signal to the first unit to be tested.

24. The method of claim 22, comprising receiving a response signal from the second unit to be tested and of analyzing the response signal.

25. The method of claim 24, wherein analyzing the response signal comprises comparing the response signal with an expected response signal representing a signal expected to be received in response to the stimulus signal.

* * * * *